United States Patent [19]

Hur

[11] Patent Number: 5,534,725
[45] Date of Patent: Jul. 9, 1996

[54] RESIN MOLDED CHARGE COUPLED DEVICE PACKAGE AND METHOD FOR PREPARATION THEREOF

[75] Inventor: Ki R. Hur, Seoul, Rep. of Korea

[73] Assignee: Goldstar Electron Co., Ltd., Choongchungbook-Do, Rep. of Korea

[21] Appl. No.: 337,016

[22] Filed: Nov. 7, 1994

Related U.S. Application Data

[63] Continuation-in-part of Ser. No. 53,534, Apr. 29, 1993, abandoned.

[30] Foreign Application Priority Data

Jun. 16, 1992 [KR] Rep. of Korea .................. 10430/1992

[51] Int. Cl.⁶ ..................... H01L 31/203; H01L 23/495
[52] U.S. Cl. .................. 257/434; 257/666; 257/680; 257/787
[58] Field of Search .................................. 257/434, 680, 257/433, 666, 681, 787

[56] References Cited

U.S. PATENT DOCUMENTS

| 4,388,525 | 6/1983 | Phy | 257/432 |
|---|---|---|---|
| 4,501,637 | 2/1985 | Mitchell et al. | 257/98 |
| 4,523,102 | 6/1985 | Kazufumi et al. | 250/578 |
| 4,585,513 | 4/1986 | Gale et al. | 156/630 |
| 4,707,725 | 11/1987 | Ito | 357/72 |
| 5,021,888 | 6/1991 | Kondou et al. | 358/213.11 |

FOREIGN PATENT DOCUMENTS

| 63-213373 | 9/1988 | Japan . |
|---|---|---|
| 63-240078 | 10/1988 | Japan . |
| 63-274162 | 11/1988 | Japan . |
| 64-35941 | 2/1989 | Japan . |
| 1-280364 | 11/1989 | Japan . |
| 1-300572 | 12/1989 | Japan . |
| 1-305577 | 12/1989 | Japan . |

*Primary Examiner*—Rolf Hille
*Assistant Examiner*—David Ostrowski
*Attorney, Agent, or Firm*—Lowe, Price, LeBlanc & Becker

[57] ABSTRACT

A resin molded CCD package and a method for preparing the CCD package by employing a transfer molding using a low-priced plastic material having a good moldability. This package comprises a semiconductor chip as a CCD, a lead frame being integrally provided with a paddle and a plurality of leads, a film wall being attached to an upper surface of the semiconductor chip such that it surrounds a light reception region of the semiconductor chip, a glass lid for sealing the light reception region and transmitting an outside light to the region, a plurality of metal wires for electrically connecting a plurality of bond pads of the semiconductor chip to individual inner leads of the lead frame, and a mold resin package body for hermetically sealing a predetermined part including the semiconductor chip and the inner leads, both being wire-bonded to each other. The present invention simplifies the preparation process of the CCD package, reduces the preparation cost and achieves the recent trend of compactness and requirement of mass production of the CCD package.

4 Claims, 3 Drawing Sheets

RESIN MOLDED CHARGE COUPLED DEVICE PACKAGE AND METHOD FOR PREPARATION THEREOF

This is continuation-in-part of Ser. No. 08/053,534 filed on Apr. 29, 1993 now abandoned.

FIELD OF THE INVENTION

The present invention relates in general to a charge coupled device (CCD) package as an optical element used in a VCR system integrated with camera, so-called a camcorder, and more particularly to a resin molded CCD package and a method for preparing such by employing a transfer molding using a low-priced plastic material having a good moldability, thereby simplifying the preparation process, reducing the preparation cost and achieving the recent trend of compactness and requirement of mass production of the CCD package.

DESCRIPTION OF THE PRIOR ART

With reference to FIG. 1, there is shown a representative embodiment of a known CCD package in sectional view.

As shown in this drawing, the known CCD comprises a package body 11 including a cavity region 11a having a large rectangular cavity and a small rectangular cavity, the latter being formed inside the former. The package body 11 also encloses a plurality of metal lead fingers 16 which are provided at opposite sides of the small cavity of the cavity region 11a as being exposed to a bottom surface of the large cavity at an end thereof and to the outer wall of the body 11 at the other end thereof. The plurality of lead fingers 16 are electrically connected, at the other ends exposed to the outer wall of the body 11, to individual out leads 12 which are in turn brazed to the outer walls of the body 11 by a brazing metal 12'. A semiconductor chip 13, having a light reception region 13a at the upper center, is positioned in the small cavity of the cavity region 11a in such a manner that it is attached to the bottom center of the small cavity and its chip pads are connected to the plurality of the lead fingers 16 by individual wires 15 by wire bonding. In addition, the cavity region 11a is covered with a glass lid 14 which is attached to the upper surface of the body 11 to seal the cavity region 11a and to allow the outside light to be transmitted to the light reception region 13a of the chip 13.

Here, the contact part between the glass lid 14 and the upper surface of the package body 11 is sealed by applying a sealant 17 having a low melting point. Also, it is preferred to use a glass having a refractive index of about 1.5 and a transmissivity of not lower than 90% as the glass lid 14.

The above CCD package is generally used as an optical element of the camcorders as being mounted on a circuit board (not shown) in a lead insert mounting such that its out leads 12 are connected to a signal processing circuit of the board.

In application, the glass lid 14 transmits an outside light or an optical image light to the light reception region 13a of the semiconductor chip 13 wherein the image light is in turn converted to an electric signal. This electric signal is outputted to the signal processing circuit through the chip pads of the semiconductor chip 13, the wires 15, the lead fingers 16 and the out leads 12 in series. Otherwise stated, the known CCD package converts the optical image from the camera of the camcorder to the electric image signal which is to be processed by the signal processing circuit.

A preparation process for the known CCD package generally comprises several steps, i.e., a package body preparation step, a die attaching step, a wire bonding step and a cavity sealing step, said steps being carried out in series. The package body preparation step provides, using a ceramic material, the package body 11 having the cavity region 11a and enclosing the plurality of lead fingers 16. The die attaching step is adapted for attaching the semiconductor chip 13, which is provided by sawing the wafer, to the cavity region 11a of the body 11. The wire bonding step is carried out to electrically connect the chip pads of the semiconductor chip 13 to the plurality of lead fingers 16 by bonding individual wires 15 to the chip pad and the lead fingers 16. In the cavity sealing step, the glass lid 14 is attached to the upper surface of the body 11 so as to cover and seal the cavity region 11a of the body 11, the sealing of the cavity region 11a being achieved by using the low melting point sealant 17 applied to the contact surface between the two members 11 and 14.

However, the method for preparation of the known CCD package has a disadvantage caused by the construction of the CCD package. That is, since it is required to provide the package body 11 made of a ceramic material and enclosing the plurality of metal lead fingers 16, the preparation process of the CCD package necessarily includes a green tape forming step and a screen printing step which are adapted for forming and arranging the lead fingers 16 by using alumina or the raw material of the fingers 16. The green tape forming step and the screen printing step along with a firing step, said firing step adapted for firing the multi-layered ceramic body 11, cause the preparation process of the CCD package to be very complex. Additionally, the brazing for attaching the plurality of out leads 12 to the outer wall of the body 11 makes the complexity of the preparation process even worse. Such a complex method for preparation of the CCD package involves additional capital investment, and furthermore, it is not suitable for mass production of the CCD package as well as a small quantity production for development of the CCD package. Another disadvantage of the known CCD package is resided in that the recent trend of compactness of the CCD package has not been achieved.

SUMMARY OF THE INVENTION

It is, therefore, an object of the present invention to provide a resin molded CCD package and a method for preparing such a CCD package by employing, like the conventional semiconductor package, a transfer molding using a low-priced plastic material having a good moldability, thereby simplifying the preparation process of the CCD package, reducing the preparation cost and achieving the recent trend of compactness and requirements of mass production of the CCD package.

In one aspect, the present invention provides a resin molded CCD package comprising: a semiconductor chip as a charge coupled device, said chip having a plurality of bond pads and a light reception region thereon; a lead frame being integrally provided with a paddle and a plurality of leads, said paddle being adapted for mounting said semiconductor chip thereon and said lead each comprising an inner lead and an outer lead; a film wall being attached to an upper surface of said semiconductor chip such that it surrounds the light reception of said semiconductor chip, said film wall having a predetermined height; a glass lid for sealing said light reception region and transmitting an outside light to said light reception region, said glass lid being attached to an upper end of said film wall; a plurality of metal wires for electrically connecting said bond pads of the semiconductor chip to individual inner leads of said lead frame; and a mold resin package body for hermetically sealing a predetermined part including said semiconductor chip and said inner leads being wire-bonded to said semiconductor chip.

In another aspect, the present invention provides a method for preparation of the resin molded CCD package comprising: a die attaching step for attaching a plurality of semiconductor chips provided by sawing a wafer to individual paddles of a lead frame; a film attaching step for attaching an insulating film wall having a predetermined height to an upper surface of each of said semiconductor chips such that said insulating film wall surrounds a light reception region of said semiconductor chip; a glass attaching step for attaching a glass lid to an upper end of said film wall, said glass lid being adapted to transmit an outside light to said light reception region; a curing step for curing said film wall so as to completely bond said glass lid to said upper end of the film wall and to seal said light reception region of the semiconductor chip; a wire bonding step for electrically connecting said semiconductor chip to individual inner leads of said lead frame by using individual metal wires; a molding step for providing a package body by a transfer molding using a mold resin, said package body hermetically sealing a predetermined part including said semiconductor chip and said inner leads being wire-bonded to said semiconductor chip; and a trimming and forming step for cutting off dam bars connecting leads of said lead frame to each other, and separating the CCD packages from each other, and bending out leads of said leads to have a predetermined bent shape.

In another embodiment, adhesive layers or tape are disposed between the film wall and both the glass lid and chip for improvements in the device and the method of making.

BRIEF DESCRIPTION OF THE DRAWINGS

The above and other objects, features and other advantages of the present invention will be more clearly understood from the following detailed description taken in conjunction with the accompanying drawings, in which:

FIGS. 2 and 3 show an embodiment of a resin molded CCD package according to the present invention, respectively, wherein;

FIG. 2 is a vertical sectional view;

FIG. 3 is a transverse sectional view;

DESCRIPTION OF THE PREFERRED EMBODIMENTS

Figure 1:
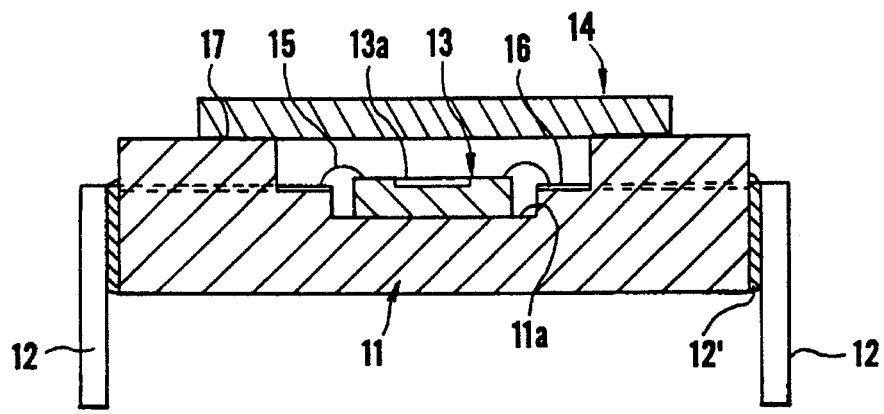
FIG. 1 is a vertical sectional view of a known CCD package.
Figure 2:
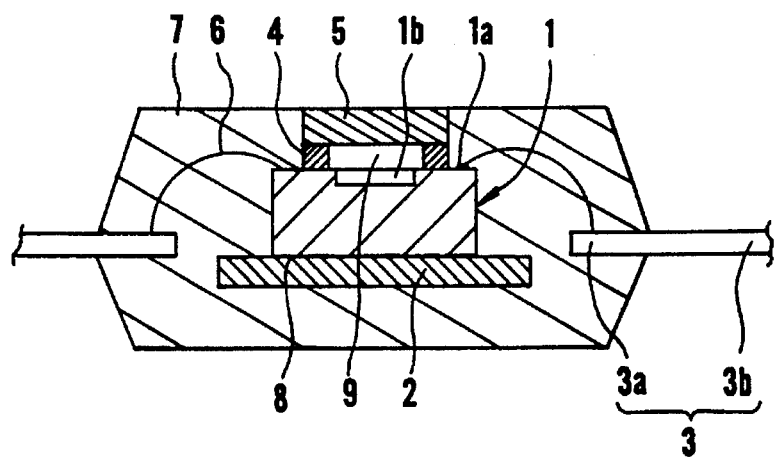
Figure 3:
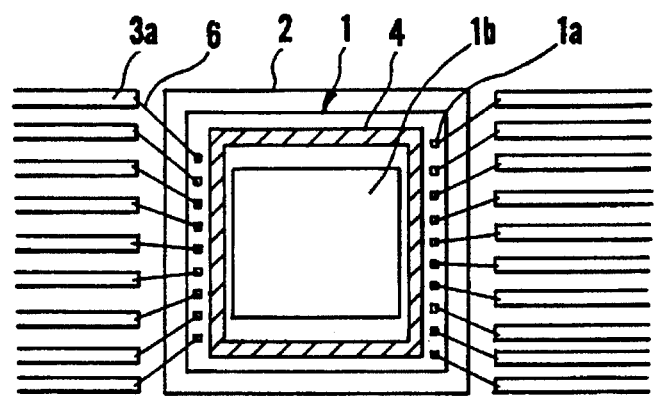

Referring now to FIGS. 2 and 3, a preferred embodiment of a resin molded CCD package of this invention is shown in a vertical sectional view and a transverse sectional view, respectively. As depicted in these drawings, the CCD package includes a semiconductor chip 1 provided with a plurality of bond pads 1a, which are arranged at opposite sides of the chip 1, and having a light reception region 1b at its upper center. The CCD package further includes a lead frame, which is integrally provided with a paddle 2 for mounting the semiconductor chip 1 thereon and a plurality of leads 3, said leads 3 each comprising an inner lead 3a and an out lead 3b. A window frame shaped film wall 4 having a predetermined height is attached to the upper surface of the semiconductor chip 1 such that it rectangularly surrounds the light reception region 1b or the chip 1. The light reception region 1b is also covered with a glass lid 5 which is attached to the upper end of the film wall 4 such that it seals the region 1b and transmits an outside light to the region 1b. The bond pads 1a of the semiconductor chip 1 are electrically connected to the inner leads 3a of the leads 3 through a plurality of metal wires 6, respectively. As best seen in FIG. 2, the package body of the CCD package comprises a mold resin body 7 provided as a result of transfer molding of a mold resin in such a manner that the body 7 encloses the wire bonded semiconductor chip 1 and the inner leads 3a, and allows the upper surface of the glass lid 5 to be exposed to the outside.

The semiconductor chip 1 is bonded to the paddle 2 of the lead frame by using an epoxy or polyimide adhesive 8. The lead frame of this invention comprises a metal lead frame which has been used in the conventional semiconductor packages molded by a plastic material.

In addition, the window frame shaped film wall 4, having the predetermined height and preferably comprising a thermosetting polymer insulating film having adhesion at its opposite said surfaces, is attached to the upper surface of the semiconductor chip 1 such that there is provided a predetermined space between the glass lid 5 and the light reception region 1b of the chip 1. In attaching the film wall 4 to the chip 1, please be careful of the bond pads 1a of the chip 1 not being covered with the film wall 4.

The glass lid 5, being tightly attached on the upper end of the window frame shaped film wall 4 to seal the light reception region 1b of the chip 1 and to transmit the outside light or the image light to the region 1b, is constructed using a high transparent glass having a refractive index of about 1.5 and a transmissivity of not lower than 90%.

In molding the package body 7 using the mold resin, it is preferred to let the upper surface of the mold resin package body 7 level with the upper surface of the glass lid 5 such that the upper surface of the lid 5 is exposed to the outside. This package body 7 is formed by employing a transfer molding using a mold press in the same manner as the conventional plastic semiconductor packages.

Figure 4:
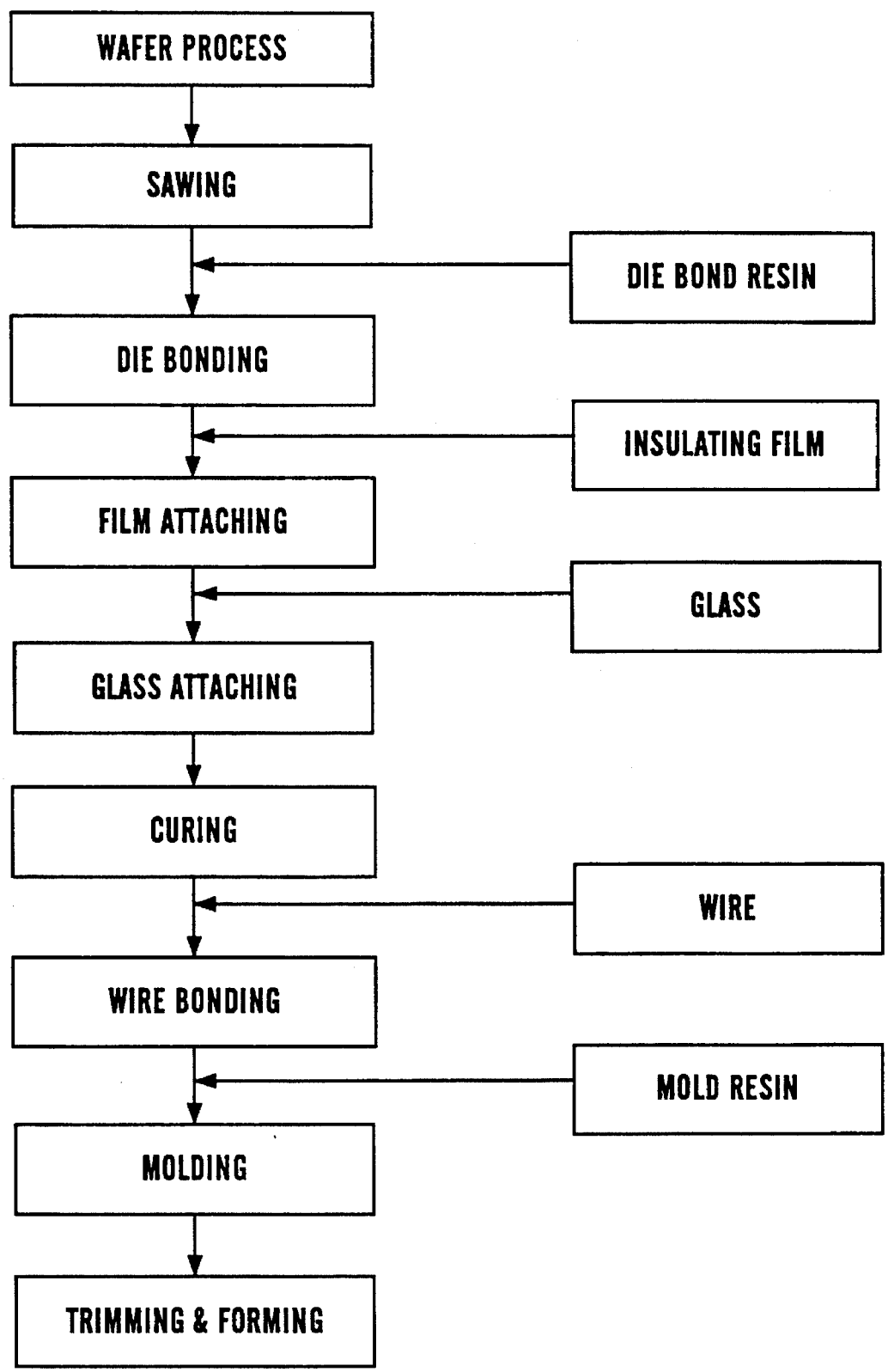
FIG. 4 is a flow diagram of the preparation process for the resin molded CCD package of the present invention.

Turning to FIG. 4, there is shown a flow diagram of the preparation process for the resin molded CCD package of this invention. As depicted in this flow diagram, the CCD package of this invention is prepared by a process comprising a series of several steps, i.e., a wafer preparing step, a sawing step, a die bonding step, a film attaching step, a glass attaching step, a curing step, a wire bonding step, a molding step and a trimming & forming step.

Figure 5:
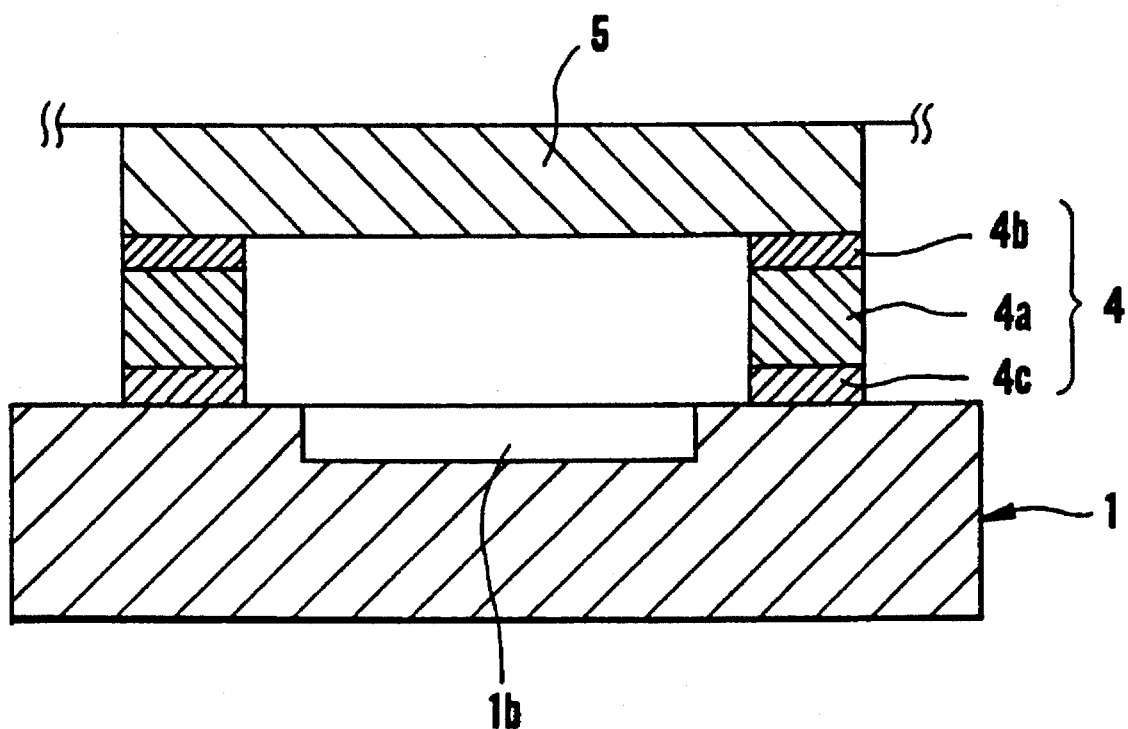
FIG. 5 is a vertical sectional view of another embodiment of the invention.

FIG. 5 shows another embodiment of the invention at both surfaces thereof. That is, the film wall 4 is provided with adhesive layers or tape to improve the bonding force between the film wall 4 and the charge coupled device 1 and between the film wall 4 and the glass lid 5. The film wall 4 consists of a polyimide layer 4a and upper and lower adhesive layers 4b and 4c formed on upper and lower surfaces of the polyimide layer 4a, respectively. The adhesive layers or tape can be any type known in the art for use in electronic devices.

If described in detail, the wafer obtained from the wafer preparing step is divided into a plurality of semiconductor chips 1 having a predetermined size through the sawing step. The semiconductor chips 1 are then attached to individual paddles 2 of the lead frame by using the adhesive 8 in the die attaching step. In the succeeding film attaching step, the window frame shaped film wall 4 made of the thermosetting polymer insulating film to have the predetermined height is attached to the upper surface of each of the semiconductor chips 1 such that it surrounds the light reception region 1b and does not cover the bond pads 1a of the chip 1.

Thereafter, the glass attaching step is carried out to attach the glass lid 5, which is to seal the light reception region 1b of the chip 1 and the transmit the outside light to the region 1b, to the upper end of the film wall 4. The glass lid 5 is in turn cured at a temperature of about 150° C. for about 1 hour in the curing step so that it is completely bonded to the upper end of the wall 4. The wire bonding step is, thereafter, carried out to electrically connect the bond pads 1a of the semiconductor chip 1 to individual inner leads 3a of the lead frame by using individual metal wires 6.

Sequentially, the result assembly is subject to the molding step. In this molding step, the transfer molding employing the mold press is carried out to provide, using the mold resin, the mold resin package body 7 which encloses the wire bonded semiconductor chip 1 as well as the inner leads 3a of the lead frame. Thereafter, the dampers (not shown) connecting the leads 3 of the lead frame to each other are cut off in the trimming step and, as a result, causes the CCD packages to be separated from each other. This trimming step is followed by the forming step wherein the protruded out leads 3b of each CCD package are bent to have a predetermined bent shape.

If briefly described, the above method for preparation of the resin molded CCD package includes the same steps as those of the conventional method for preparation of the known plastic packages except addition of the film attaching step and the glass attaching step. This method achieves mass production of the CCD packages as well as the recent trend of compactness of the CCD package.

As described above, the present invention provides a resin molded CCD package provided with a mold resin package body prepared by a transfer molding using a mold resin like the conventional plastic packages, thereby achieving the recent trend of compactness of the CCD package. The present invention also provides a method for preparation of the CCD package which is simplified and reduced in its processing time as well as the preparation cost thanking for the simple construction of the package. This method is also suitable for mass production of the CCD package.

Another advantage of the resin molded CCD package of this invention is resided in that the forming type of the out leads of the leads can be changed as required, thereby providing several types of CCD packages. Otherwise stated, differently from the known CCD package where the out leads are brazed to the outer wall of the package body to cause the package to be mounted on the circuit board only in the lead insert mounting, the CCD package of this invention having the same shape as the conventional semiconductor package can be mounted on the circuit board in surface mounting as well as in the lead insert mounting owing to the possibility of optional forming of the out leads.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

I claim:

1. A resin molded charge coupled device package comprising:

a charge coupled device, said charge coupled device having a plurality of bond pads and a light reception region thereon;

a lead frame being integrally provided with a paddle and a plurality of leads, said paddle being adapted for mounting said charge coupled device thereon and said leads each comprising an inner lead and an outer lead;

a film wall having a polyimide layer and upper and lower adhesive layers formed on upper and lower surfaces of said polyimide layer, respectively, said lower adhesive layer being attached to an upper surface of said charge coupled device for providing a bonding force between said polyimide layer and said charge coupled device, said film wall being attached between said bond pads and said light reception region of said charge coupled device such that it surrounds the light reception region of said charge coupled device, said film wall having a predetermined height;

a glass lid for sealing said light reception region and transmitting an outside light to said light reception region, said glass lid being attached to said upper adhesive layer of said film wall;

a plurality of metal wires for electrically connecting said bond pads of the charge coupled device to individual inner leads of said lead frame; and a mold resin package body for hermetically sealing said charge coupled device and said inner leads being wire-bonded to said charge coupled device up to a side surface of the glass lid.

2. The resin molded charge coupled device package of claim 1, wherein said film wall includes an insulating thermosetting polymer.

3. The resin molded charge coupled device package of claim 1, wherein said glass lid has a refractive index of about 1.5 and a transmissivity of not lower than 90%.

4. The resin molded charge coupled device package of claim 2, wherein said glass lid has a refractive index of about 1.5 and a transmissivity of not lower than 90%.

* * * * *